(12) United States Patent
Clevenger et al.

(10) Patent No.: US 9,899,317 B1
(45) Date of Patent: Feb. 20, 2018

(54) NITRIDIZATION FOR SEMICONDUCTOR STRUCTURES

(71) Applicant: International Business Machines Corporation, Armonk, NY (US)

(72) Inventors: Lawrence A. Clevenger, Rhinebeck, NY (US); Roger A. Quon, Rhinebeck, NY (US); Hosadurga K. Shobha, Niskayuna, NY (US); Terry A. Spooner, Clifton Park, NY (US); Wei Wang, Yorktown Heights, NY (US); Chi-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/279,775

(22) Filed: Sep. 29, 2016

(51) Int. Cl.
| | | |
|---|---|---|
| H01L 23/522 | (2006.01) | |
| H01L 23/528 | (2006.01) | |
| H01L 23/532 | (2006.01) | |
| H01L 21/3065 | (2006.01) | |

(52) U.S. Cl.
CPC ...... H01L 23/5226 (2013.01); H01L 21/3065 (2013.01); H01L 23/528 (2013.01); H01L 23/53233 (2013.01); H01L 23/53266 (2013.01)

(58) Field of Classification Search
CPC ......... H01L 23/53238; H01L 23/53266; H01L 23/5226; H01L 23/53257; H01L 23/53228; H01L 23/53233; H01L 23/53261
See application file for complete search history.

(56) References Cited

U.S. PATENT DOCUMENTS

| | | | |
|---|---|---|---|
| 2,462,640 A | 2/1949 | Hyde | |
| 6,294,458 B1 | 9/2001 | Zhang et al. | |
| 6,667,231 B1 | 12/2003 | Wu | |
| 6,919,636 B1 * | 7/2005 | Ryan ................. | H01L 21/76807 257/751 |
| 7,081,674 B2 * | 7/2006 | Ganapathiraman ... | H01L 21/288 257/751 |
| 7,211,520 B2 | 5/2007 | Zschiescha et al. | |
| 7,510,942 B2 * | 3/2009 | Dey ...................... | B82Y 10/00 257/E29.345 |
| 8,344,367 B2 | 1/2013 | Kim et al. | |
| 8,420,531 B2 | 4/2013 | Yang et al. | |
| 8,440,564 B2 * | 5/2013 | Yu ...................... | H01L 21/76849 257/E21.199 |

(Continued)

FOREIGN PATENT DOCUMENTS

| | | |
|---|---|---|
| CN | 104862657 A | 8/2015 |
| WO | 2010097261 A1 | 9/2010 |

OTHER PUBLICATIONS

English translation for China Application No. CN104862657A.

(Continued)

*Primary Examiner* — Jose R Diaz
(74) *Attorney, Agent, or Firm* — Vazken Alexanian; Ryan, Mason & Lewis, LLP

(57) ABSTRACT

A method for fabricating a semiconductor structure includes the following steps. A substrate including a dielectric material is formed. A surface of the substrate is molecularly modified to convert the surface of the substrate to a nitrogen-enriched surface. A metal layer is deposited on the molecularly modified surface of the substrate interacting with the molecularly modified surface to form a nitridized metal layer.

18 Claims, 4 Drawing Sheets

(56) References Cited

U.S. PATENT DOCUMENTS

| | | | |
|---|---|---|---|
| 8,785,215 | B2 | 7/2014 | Kobayashi et al. |
| 8,946,083 | B2* | 2/2015 | JangJian ............ H01L 21/3105 |
| | | | 257/751 |
| 8,957,519 | B2 | 2/2015 | Yang et al. |
| 2005/0191801 | A1 | 9/2005 | Zschieschang et al. |
| 2006/0220251 | A1* | 10/2006 | Kloster ............ H01L 21/02126 |
| | | | 257/758 |
| 2008/0290337 | A1 | 11/2008 | Halik et al. |
| 2010/0212944 | A1 | 8/2010 | Gelorme et al. |
| 2015/0179579 | A1 | 6/2015 | Jezewski et al. |
| 2016/0042991 | A1 | 2/2016 | Chiang et al. |

OTHER PUBLICATIONS

J.A. Wilks et al., "Nitridation of Organo-Silicate Glass: A Self-Limiting Process for PVD Ta1+xN/Ta Barrier Formation," Applied Surface Science, Sep. 2009, pp. 9543-9547, vol. 255, No. 23.

\* cited by examiner

300

NITRIDIZATION FOR SEMICONDUCTOR STRUCTURES

BACKGROUND

A semiconductor integrated circuit chip is typically fabricated with a back-end-of-line (BEOL) interconnect structure, which comprises multiple levels of metal wiring and inter-level metal vias, to connect various integrated circuit components and devices that are fabricated as part of a front-end-of-line (FEOL) layer of the semiconductor integrated circuit chip. Current state of the art BEOL process technologies typically implement copper to form BEOL interconnects, as the use of copper interconnects, as compared to conventional aluminum interconnects, are known to significantly reduce resistance in the BEOL interconnect structure, resulting in improved conduction and higher performance. As copper interconnect structures are scaled down, however, current density in the copper interconnect structures increases exponentially, resulting in current-driven electromigration of copper atoms. In the context of copper interconnect structures, electromigration is the transport of the copper material caused by the gradual movement of ions in the copper interconnect structures due to momentum transfer between conducting electrons and diffusing copper atoms. When copper interconnect structures undergo electromigration, the copper atoms can diffuse away from the copper interconnect structures and into other regions of the integrated circuit, thereby leading to various defects in the copper interconnect structure and in the other regions to which copper atoms diffuse.

A barrier metal is a material used in integrated circuits to chemically isolate semiconductor material from soft metal interconnect material, while maintaining an electrical connection between the two materials. For instance, in the BEOL interconnect structure described above, a layer of barrier metal typically surrounds each copper interconnect. This prevents diffusion of copper into the surrounding semiconductor material. As such, a barrier metal is typically comprised of a material that is inert so as to mitigate soft metal (e.g., copper) contamination while being conductive enough to allow the flow of electricity from the interconnect to other surrounding regions. However, typical barrier metals (e.g., chromium (Cr), tantalum (Ta), titanium (Ti), tungsten (W), etc.) do not adhere well to the surrounding regions of the interconnect structure such as dielectric materials.

SUMMARY

Illustrative embodiments of the invention provide techniques for fabricating enhanced barrier metal layers in semiconductor structures.

For example, in one embodiment, a method for fabricating a semiconductor structure comprises the following steps. A substrate comprising a dielectric material is formed. At least a portion of a surface of the substrate is molecularly modified to convert at least a portion of the surface of the substrate to a nitrogen-enriched surface. A metal layer is deposited on the molecularly modified surface of the substrate interacting with the molecularly modified surface to form a nitridized metal layer.

In another embodiment, a semiconductor structure comprises a substrate. The substrate comprises a dielectric material and a surface. At least a portion of the surface of the dielectric material is molecularly modified to form a nitrogen-enriched dielectric material surface. A metal layer is deposited on the molecularly modified surface of the dielectric material interacting with the nitrogen-enriched dielectric material surface to form a nitridized metal layer.

In yet another embodiment, an integrated circuit comprises a substrate. The substrate comprises a dielectric material and a surface. At least a portion of the surface of the dielectric material is molecularly modified to form a nitrogen-enriched dielectric material surface. A metal layer is deposited on the molecularly modified surface of the dielectric material interacting with the nitrogen-enriched dielectric material surface to form a nitridized metal layer. A metal interconnect layer is deposited on the nitridized metal layer.

Advantageously, in one or more illustrative embodiments, a non-nitridized metal material (such as, but not limited to, tantalum, titanium, etc.) is deposited on the molecularly modified surface of the substrate such that the non-nitridized metal material becomes nitridized upon adhesion to the substrate. This nitridization process strengthens the metal/dielectric interface to withstand subsequent manufacturing processes and provide parametric advantage.

Other embodiments will be described in the following detailed description of embodiments, which is to be read in conjunction with the accompanying figures.

DETAILED DESCRIPTION

Figure 1A:
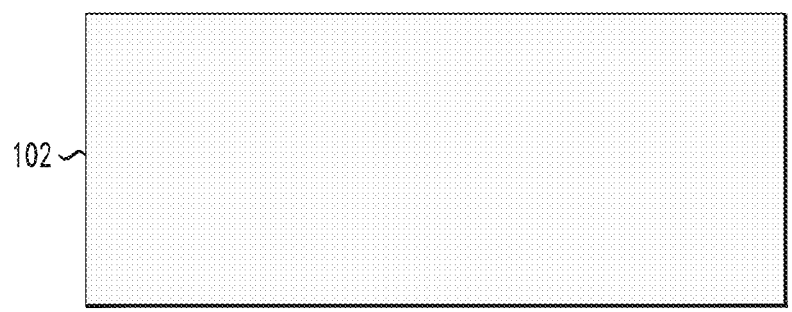
FIG. 1A is a schematic cross-sectional side view of a portion of a semiconductor structure at a first-intermediate fabrication stage, according to an embodiment of the invention.

Embodiments will now be described for fabricating semiconductor structures and integrated circuits with molecularly modified dielectric surfaces used to nitridize metal layers formed thereon. While such fabrication techniques are widely applicable to various types of semiconductor structures and integrated circuits, one or more illustrative embodiments described herein create nitridized barrier metal layers for interconnect structures such as, but not limited to, vias. Thus, in accordance with embodiments described herein, a nitridized barrier metal layer is considered an example of an "enhanced" barrier metal layer.

As used herein, the term "nitridize" (or "nitridization" or "nitridation") refers to a process of modifying a semiconductor surface in order to create a nitrogen-enriched surface on the semiconductor surface. The level of nitrogen that constitutes "nitrogen-enriched" is dependent on the particular type of structure or device with which the given surface is implemented. Nonetheless, "nitrogen-enriched" means that the given surface has a higher nitrogen content after performing the nitridization process as compared to the given surface prior to the nitritization process. Furthermore, as illustratively used herein, the dielectric substrate with the molecularly modified surface is referred to as being "nitridizing," while the metal layer deposited on the molecularly modified surface is referred to as being "nitridized."

It is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the figures, the illustrated scale of one layer, structure, and/or region relative to another layer, structure, and/or region is not necessarily intended to represent actual scale.

As mentioned above, barrier metals used to mitigate electromigration of copper atoms from copper interconnects to surrounding regions may not sufficiently adhere to the surrounding regions. For example, regions that surround a copper interconnect may comprise porous dielectrics or tetraethyl orthosilicate (TEOS). These materials and/or cross linking agents may hamper adhesion of a barrier metal during semiconductor processing. Dielectrics may contain surface hydroxyls (a chemical functional group containing one oxygen atom connected by covalent bonding to one hydrogen atom, i.e., —OH), or may entrain water, thereby weakening the metal/dielectric interface. It is realized herein that treating dielectrics in a way to sufficiently strengthen these metal/dielectric interfaces to withstand semiconductor processing provides a parametric advantage. Examples of parametric advantage are lower electric resistance of the metal conductor and less electromigration of the interconnect.

Nitridization, as will be explained in detail herein, alleviates the above-mentioned and other challenges. More particularly, treating dielectric surfaces in a way so to create a nitrogen (N)-enriched surface strengthens the metal/dielectric interface. However, performing nitridization processes using existing technology introduces throughput limitations and, more critically, these processes may only be effective over a certain time window, thereby limiting robustness. Moreover, existing processes are generally expensive and not stable. For example, the nitrogen tends to leave the surface when exposed outside of a vacuum, thus compromising the metal/dielectric interface.

Accordingly, illustrative embodiments are described herein that provide for semiconductor structure fabrication with an enhanced or improved barrier metal layer. FIGS. 1A through 1D illustrate a method for fabricating a semiconductor structure having a nitridized barrier metal layer. For the purpose of clarity, several fabrication steps leading up to the fabrication stage shown in FIG. 1A are omitted. In other words, substrate 102 does not necessarily start out in the form illustrated in the schematic representation of FIG. 1A, but may develop into the illustrated structure over one or more well-known processing steps which are not illustrated but are well-known to those of ordinary skill in the art. Also, note that the same reference numeral (100) is used to denote the schematic illustrating the process through the various intermediate fabrication stages illustrated in FIGS. 1A-1D. Note also that the substrate 102 can also be considered to be comprised within a semiconductor structure, a semiconductor device and/or an integrated circuit, or some part thereof.

The substrate 102 in FIG. 1A is a dielectric material. It is to be understood that dielectric substrate 102 may itself be formed upon a separate substrate (not expressly shown) which may comprise a semiconducting material, an insulating material, a conductive material or any combination thereof.

The dielectric substrate 102 employed in illustrative embodiments comprises any interlevel or intralevel dielectric (ILD) including inorganic dielectrics or organic dielectrics. In one embodiment, the dielectric substrate 102 may be non-porous. In another embodiment, the dielectric substrate 102. Some examples of suitable dielectrics that can be used as the dielectric substrate 102 include, but are not limited to, $SiO_2$, silsesquioxanes, carbon doped oxides (i.e., organosilicates) that include atoms of silicon (Si), carbon (C), oxygen (O), and hydrogen (H), thermosetting polyarylene ethers, or multilayers thereof. The term "polyarylene" is illustratively used herein to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the dielectric substrate 102 has a dielectric constant (k) that is about 4.0 or less (a so-called low-k dielectric), with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the dielectric substrate 102 may vary depending upon the type of dielectric material used as well as the exact number of dielectrics layers within the dielectric material. Typically, and for normal interconnect structures, the dielectric substrate 102 has a thickness from about 50 nanometers (nm) to about 1000 nm.

In some embodiments, not shown, a hard mask can be formed on an upper surface of the dielectric substrate 102. When present, the hard mask can include an oxide, a nitride, an oxynitride or any multilayered combination thereof. In one embodiment, the hard mask is an oxide such as silicon dioxide, while in another embodiment the hard mask is a nitride such as silicon nitride.

The hard mask is formed utilizing a conventional deposition process including, for example, chemical vapor deposition (CVD), plasma enhanced chemical vapor deposition (PECVD), chemical solution deposition, evaporation, and physical vapor deposition (PVD). Alternatively, the hard mask may be formed by one of thermal oxidation, and thermal nitridization.

The thickness of the hard mask employed may vary depending on the material of the hard mask itself as well as the techniques used in forming the same. Typically, the hard mask has a thickness from about 5 nm to about 100 nm, with a thickness from about 10 nm to about 80 nm being even more typical.

Figure 1B:
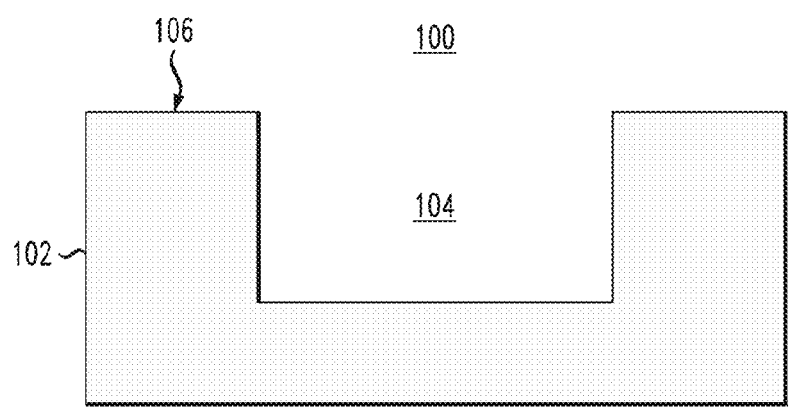
FIG. 1B is a schematic cross-sectional side view of a portion of a semiconductor structure at a second-intermediate fabrication stage, according to an embodiment of the invention.

Next, and as shown in FIG. 1B, at least one opening 104 is formed into the hard mask, if present, and into the dielectric substrate 102 utilizing lithography and etching. When a hard mask is not present, the at least one opening 104 is formed only into the dielectric substrate 102. The lithographic process includes forming a photoresist (not shown) directly on the hard mask, if present, or directly on the dielectric substrate 102, if the hard mask is not present, exposing the photoresist to a desired pattern of radiation and developing the exposed photoresist utilizing a conventional resist developer. The etching process includes a dry etching process (such as, for example, reactive ion etching, ion beam etching, plasma etching or laser ablation), and/or a wet chemical etching process. Typically, reactive ion etching is used in providing the at least one opening 104 into at least the dielectric substrate 102. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying dielectric substrate 102.

The depth of the at least one opening 104 that is formed into the dielectric substrate 102 (measured from the upper surface of the dielectric substrate 102 or mouth of the opening 104 to the bottom of the opening 104) may vary. In some embodiments, the at least one opening 104 may extend entirely through the dielectric substrate 102 (e.g., interconnect structure in FIG. 5). In yet other embodiments, the at least one opening 104 stops within the dielectric substrate 102 itself. In yet further embodiments, different depth openings can be formed into the dielectric substrate 102.

The at least one opening 104 that is formed may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1B, and by way of an example, the at least one opening 104 is shown as a line opening. It is noted that although the drawings illustrate a single opening, embodiments are not limited to forming only one opening into the dielectric substrate 102. Instead, a plurality of openings can be formed. When a plurality of openings is formed, each opening can be a line opening, a via opening, a combined via/line opening or any combination thereof.

When a via or line is formed, a single damascene process (including the above mentioned lithography and etching steps) can be employed. When a combined via/line is formed a dual damascene process (including at least one iteration of the above mentioned lithography and etching steps) can be employed.

In some embodiments, the hard mask (not expressly shown but described above) that can be formed atop the dielectric substrate 102 can be removed from the structure after the dielectric substrate 102 has been patterned to include the at least one opening 104. The removal of the hard mask, which is also patterned, can be achieved by utilizing a conventional planarization process such as, for example, chemical mechanical planarization (CMP). In some other embodiments, the patterned hard mask can remain on the upper horizontal surface of the dielectric substrate 102 and the patterned hard mask is then removed during a subsequent planarization step.

Note that the surface 106 of the dielectric substrate 102 comprises the top surfaces of the dielectric substrate 102 as well as the surfaces of the dielectric substrate 102 within the at least one opening 104.

Figure 1C:
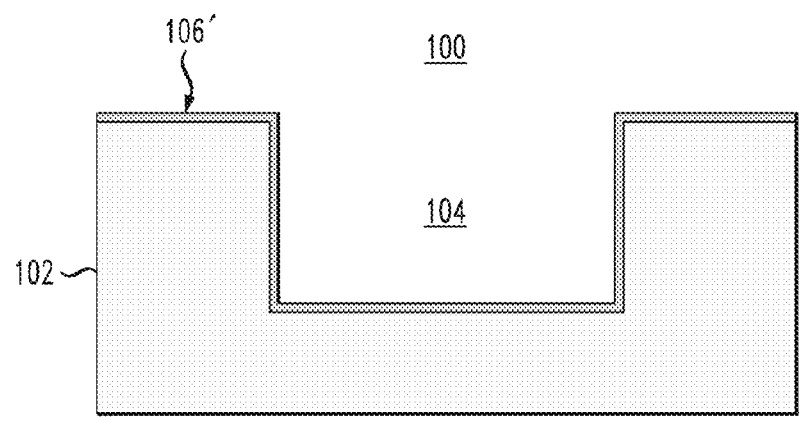
FIG. 1C is a schematic cross-sectional side view of a portion of a semiconductor structure at a third-intermediate fabrication stage, according to an embodiment of the invention.

Referring to FIG. 1C, there is illustrated the structure of FIG. 1B after performing a molecular modification process to convert the surface 106 of the dielectric substrate 102 to a nitrogen-enriched surface 106'. As shown, nitrogen-enriched surface 106' comprises surfaces of the dielectric substrate 102 including within the at least one opening 104 and atop the horizontal surface of the dielectric substrate 102. The nitrogen-enriched dielectric surface 106' may also be referred to as a nitridizing surface, as will be further explained.

The depth of the nitrogen-enriched dielectric surface 106' may vary depending on the type of molecular modification performed. Typically, the depth of the nitrogen-enriched dielectric surface 106', as measured from the outer most exposed surface of the dielectric substrate 102 inward, is from about 0.5 nm to about 20 nm, with a depth from about 1 nm to about 10 nm being more typical.

Figure 2:
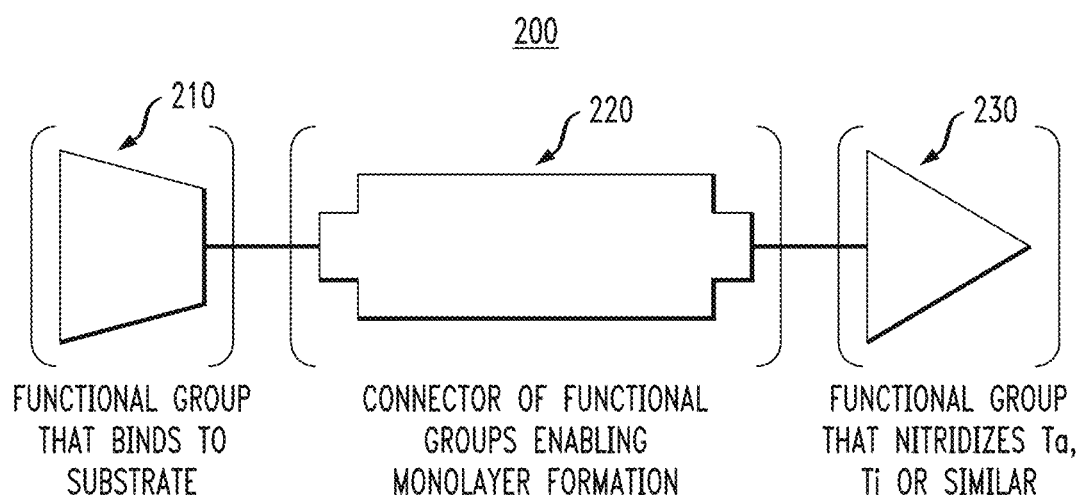
FIG. 2 illustrates a molecule configured to modify a dielectric surface to nitridize a metal layer formed thereon, according to an embodiment of the invention.
Figure 3:
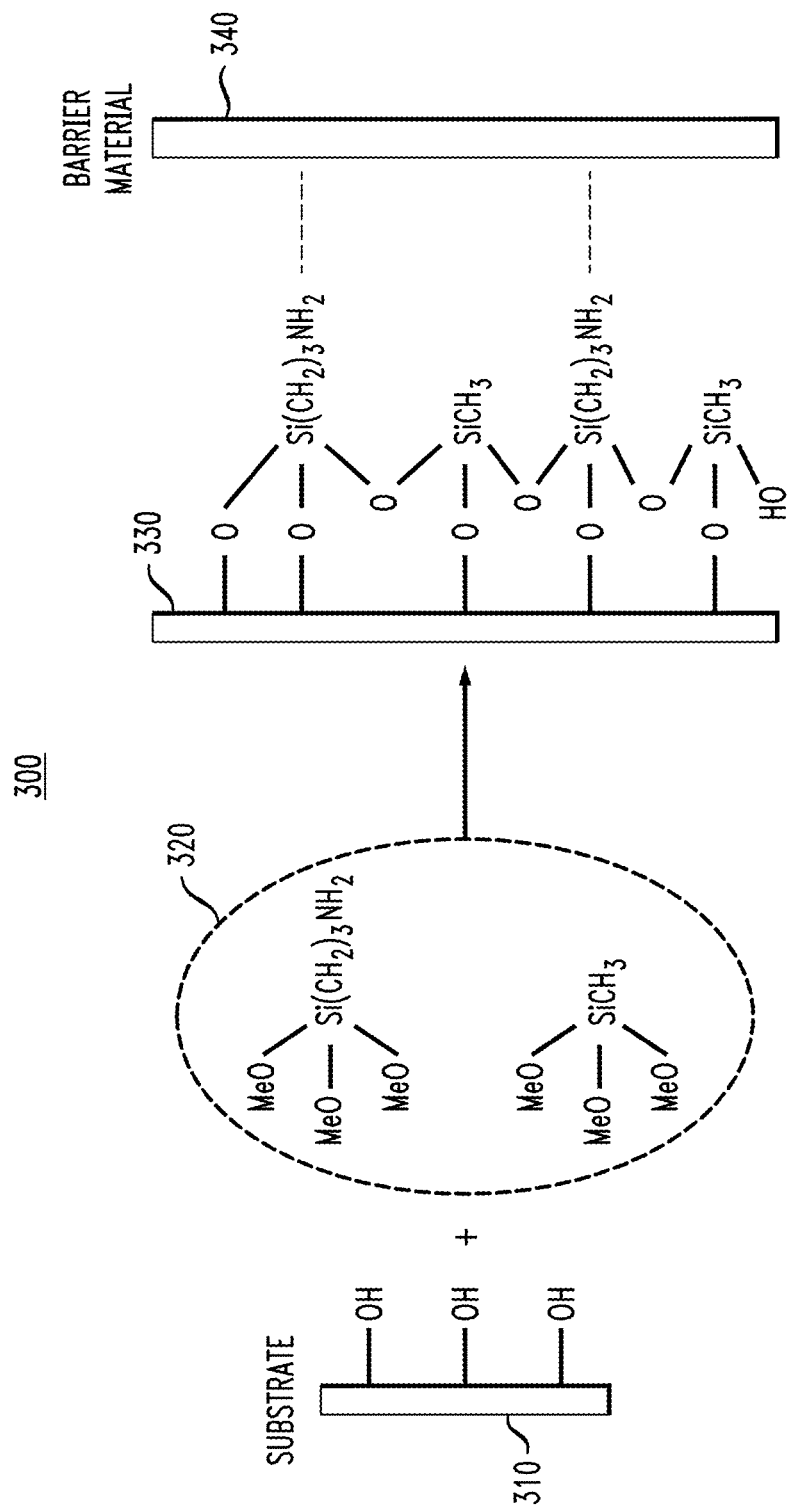
FIG. 3 illustrates molecular modification of a dielectric surface and adhesion of a metal layer in a semiconductor structure, according to an embodiment of the invention.
Figure 4:
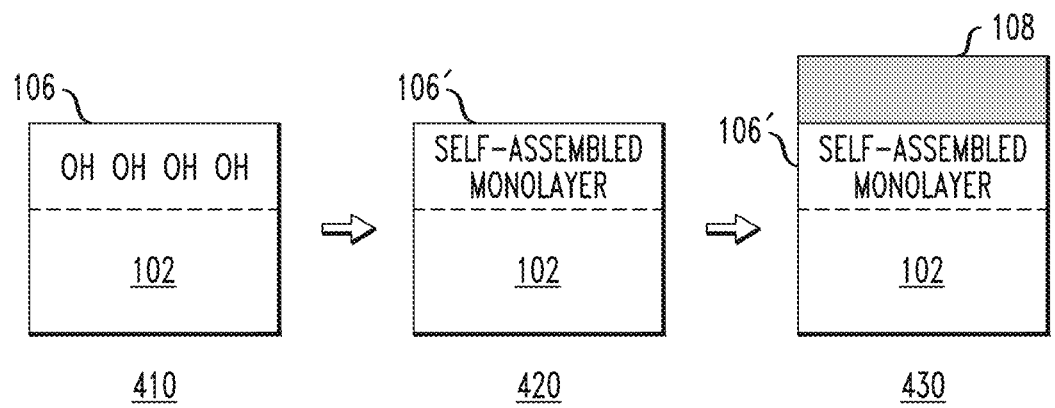
FIG. 4 illustrates further details of a schematic cross-sectional side view of a portion of a semiconductor structure through various intermediate fabrication stages, according to an embodiment of the invention.

As will be explained in further detail, the molecular modification process that creates the nitrogen-enriched surface 106' on the dielectric substrate 102 can be, in one embodiment, a silylation process and, in another embodiment, monolayer deposition of nitridizing element(s). Silylation is the introduction of a substituted silyl group to a molecule, in this case, a nitrogen molecule. Monolayer deposition is a process whereby the monolayer is a set of molecular components (a single layer of molecules) that self-assembles on the original surface 106 of the dielectric substrate 102. FIGS. 2-4 will be used to describe one or more illustrative embodiments of the monolayer deposition process.

Figure 1D:
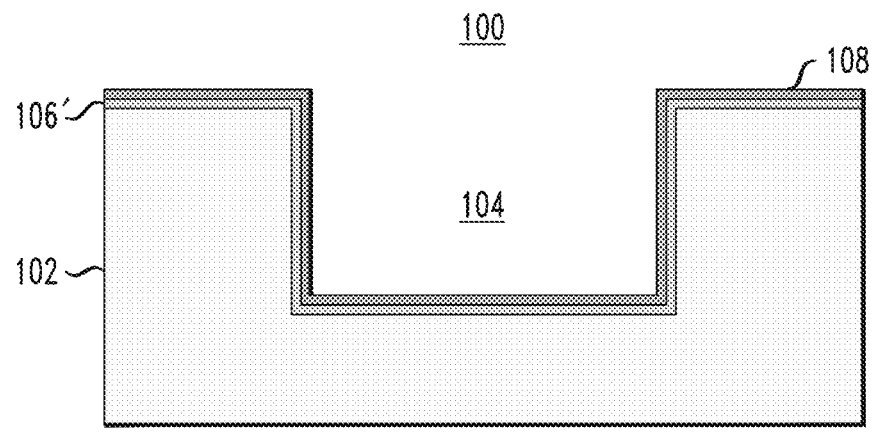
FIG. 1D is a schematic cross-sectional side view of a portion of a semiconductor structure at a fourth-intermediate fabrication stage, according to an embodiment of the invention.

Next, and as shown in FIG. 1D, a barrier metal layer 108 is deposited on the molecularly modified surface 106' of the dielectric substrate 102. More particularly, FIG. 1D illustrates the structure of FIG. 1C after forming a barrier metal layer 108 (e.g., a metal diffusion barrier liner) on the nitrogen-enriched dielectric surface 106'. As will be further explained below in the context of FIGS. 2-4, the barrier metal deposited to form the layer 108 reacts with nitrogen atoms from the underlying nitrogen-enriched dielectric surface 106'. The barrier metal deposited to form the layer 108 includes, but is not limited to, Ta, Ti, ruthenium (Ru), RuTa, cobalt (Co), or W. In one embodiment, Ta is employed as the material for the barrier metal layer 108. The barrier metal layer 108 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

As mentioned above, the barrier metal deposited to form the layer 108 reacts with nitrogen atoms from the underlying nitrogen-enriched dielectric surface 106'. As such, the barrier metal deposited to form the layer 108, which may be considered as being non-nitridized before deposition, becomes nitridized due to the reaction with the nitrogen-enriched dielectric surface 106'. Thus, advantageously, while depositing a non-nitridized barrier metal (e.g., Ta, Ti, etc.) on a dielectric substrate without the molecular modification process described herein results in poor adhesion between the barrier metal and the dielectric substrate, implementation of the molecular modification process whereby the barrier metal becoming nitridized results in improved adhesion between the barrier metal and the dielectric substrate. As such, the above-mentioned problem of copper electromigration in the interconnect structure, as well as other drawbacks with existing approaches, are alleviated.

The thickness of the barrier metal layer 108 may vary depending on the deposition process used as well as the material employed. Typically, the barrier metal layer 108 has a thickness from about 2 nm to about 50 nm, with a thickness from about 5 nm to about 20 nm being more typical. It is to be appreciated that after further processing of the semiconductor structure 100 to complete the interconnect structure, as will be described in further detail below, the barrier metal layer 108 is continuously present, i.e., with no breaks in the layer, in the at least one opening 104 of the structure. In embodiments, in which a patterned hard mask is present atop the dielectric substrate 102, the nitrogen-enriched dielectric surface 106' and the subsequent formation of the barrier metal layer 108 occur only within the at least one opening 104.

In some embodiments, an optional plating seed layer (not expressly shown) can be formed on the surface of the barrier metal layer 108. The optional plating seed layer can be employed to selectively promote subsequent electroplating of a pre-selected conductive metal or metal alloy. The optional plating seed layer may comprise Cu, a Cu alloy, iridium (Ir), an Ir alloy, Ru, a Ru alloy (e.g., TaRu alloy), Co, a Co alloy, or any other suitable noble metal or noble metal alloy having a low metal-plating overpotential. Typically, Cu or a Cu alloy plating seed layer is employed, when a Cu metal is to be subsequently formed within the at least one opening 104.

The thickness of the optional seed layer may vary depending on the material of the optional plating seed layer as well as the technique used in forming the same. Typically, the optional plating seed layer has a thickness from about 2 nm to about 80 nm. The optional plating seed layer can be formed by a conventional deposition process including, for example, CVD, PECVD, ALD, and PVD.

Before describing further details of the molecular modification process used to nitridize the barrier metal layer 108, further details of the subsequent steps performed on the semiconductor structure 100 to complete formation of an interconnect structure will be described. It is to be appreciated that an illustrative embodiment of such an interconnect structure will be further described later in the context of FIG. 5.

Following deposition of the barrier metal layer 108, and an optional plating seed layer, a metallization process is performed. For instance, a conductive material is deposited atop the barrier metal layer 108. The conductive material completely fills the remaining portions of the at least one opening 104 and extends above the opening and on the horizontal portions of layer 108 that are outside the opening 104 (or on the dielectric surface if the horizontal portion of the layer 108 has already been removed). The conductive material may comprise polySi, silicon-germanium (SiGe), a conductive metal, an alloy comprising at least one conductive metal, a conductive metal silicide or combinations thereof. In one embodiment, the conductive material is a conductive metal such as Cu or a Cu alloy.

The conductive material may be formed by any conventional deposition process including chemical vapor deposition (CVD), plasma enhanced chemical vapor deposition (PECVD), sputtering, chemical solution deposition or plating that fills the at least one opening 104 from the bottom upwards. In one embodiment, the conductive material is formed utilizing a bottom-up plating process.

After depositing the conductive material, a planarization process such as, for example, chemical mechanical polishing (CMP) and/or grinding, is employed to remove portions of the conductive material and the barrier metal layer 108 that extend above the mouth of the at least one opening 104. In the embodiment, the planarization step also removes the nitrogen-enriched dielectric surface 106' from atop the horizontal portion of the dielectric substrate 102. In embodiments in which a patterned hard mask is present, the planarization process can also be used to remove the patterned hard mask from the structure.

As described above, the surface of the dielectric substrate 102 is molecularly modified to create the nitrogen-enriched surface 106' on the dielectric substrate 102. In one embodiment, monolayer deposition is performed to achieve such surface modification. Monolayer deposition is a process whereby the monolayer is a set of molecular components (a single layer of molecules) that self-assembles on the original surface 106 of the dielectric substrate 102. The nitrogen-enriched dielectric surface 106' then receives a barrier metal layer, such as Ta, Ti, or similar metal. The monolayer is thus comprised of a plurality of molecules whereby each molecule has the following characteristics: (i) a first terminal end with a chemical functionality (functional group) which bonds, by chemical reaction or physisorption, with the surface 106 of the substrate 102; (ii) a second terminal end with a nitrogen-based functionality (functional group) that coordinates with Ta, Ti, or similar metal, to promote the adhesion of the metal with the substrate 102; and (iii) a connector joining the first terminal end to the second terminal end that enables the formation of a monolayer of these molecules across the surface 106 of substrate 102.

With reference to FIG. 2, a functional diagram is provided illustrating molecule 200, in accordance with one or more embodiments, configured to exhibit the above-described characteristics. Molecule 200 is shown comprising first terminal end 210 and second terminal end 230 each connected to connector 220. First terminal end 210 comprises a first functional group that is configured to bond to a substrate surface. For example, the functional group of first terminal end 210 may react with hydroxyl, which may be found in common porous dielectrics. In one embodiment, first terminal end 210 is comprised of a siloxane functional group (e.g., $(HO)_3$—Si—). In alternative embodiments, first terminal end 210 may comprise other functional groups configured to bond to a substrate surface in accordance with embodiments described herein. Other suitable functional groups that may form first terminal end 210 include, but are not limited to $(HO)_3$—$SiH_x$—, where x is 1 or 2, and $(HO)_{4-x}$—$CH_x$—, where $1 \leq x \leq 3$. For example, one substrate binding group includes, but is not limited to, $CH_2$—$CH_2$—Si—$(OCH_3)_3$ (3-[2-(trimethoxysiyl) ethyl] pyridine).

The second terminal end 230 is comprised of a second functional group that is configured to nitridize Ta, Ti, or any barrier metal material in accordance with embodiments described herein. In one embodiment, second terminal end 230 comprises an amine functional group (i.e., —$NH_2$). Amine termination will coordinate with Ta, Ti or similar liner material for semiconductors. In alternative embodiments, second terminal end 230 may comprise other functional groups configured to nitridize Ta, Ti, or any barrier metal material in accordance with embodiments described herein. Other suitable functional groups that may form second terminal end 230 include, but are not limited to, a nitrile functional group (i.e., —C≡N), and an azide functional group (i.e., R—N=N$^+$=N$^-$), where the "R" represents a carbon-based molecule.

Connector 220 comprises a third functional group. In one embodiment, connector 220 comprises a methylene group (i.e., —(CH$_2$)$_n$—), where "n" represents the number of linked methylene groups. The carbon in the methylene group is configured to bond to a substrate functional group (e.g., covalently bond). Note that here "n" represents the number of linked methylene groups, where n>0. In alternative embodiments, connector 220 may be comprised of different functional groups configured to enable the formation of a monolayer. For example, connector 220 may be comprised of silicon-based group such as —(SiH$_2$)$_n$— or —(Si$_m$C$_n$H$_p$)$_z$—, where m, n, and p>0, having a stoichiometric combination of Si, C and H that allows bonding of Si or C to the terminal functional groups. Thus, connector 220 is configured to join first and second terminal ends 210 and 230.

It is to be appreciated that a plurality of molecules, each having the structure shown in molecule 200 in FIG. 2, are deposited across the surface 106 of the substrate 102 to enable the formation of a monolayer of molecules. A monolayer may typically be understood to mean that the layer of molecules is a single molecule in depth. However, as used herein in accordance with one or more illustrative embodiments, the term "monolayer" may represent both a layer of molecules that is a single molecule in depth, as well as a layer of molecules that is deeper than a single molecule at some or all of the length of the monolayer.

Thus, the molecule 200 of FIG. 2 is comprised within a monolayer wherein each such molecule 200 terminates with a nitridizing functional group that allows for adhesion of a non-nitridized barrier metal to thereby form a nitridized barrier metal layer. In one embodiment, the monolayer is a self-assembling monolayer. The term "self-assembled" refers to organic molecular assemblies formed spontaneously on surfaces by adsorption that are organized into more or less large ordered domains.

An exemplary list of candidates for molecule 200 includes, but is not limited to, an aminoalkyl siloxane (e.g., H$_2$N—(CH$_2$)$_n$—Si(OCH$_3$)$_3$), CH$_3$—NH—CH$_2$CH$_2$—Si(OCH$_3$)$_3$, an ethylene diamine based precursor for cyclic chelation (e.g., H$_2$N—CH$_2$—CH$_2$—NH—CH$_2$—CH$_2$—Si(OCH$_3$)$_3$), a cyanoalkyl siloxane (e.g., NC—(CH$_2$)$_n$—Si(OCH$_3$)$_3$), and a silane coupling agent with heterocyclics.

An exemplary process for performing the above-described molecular modification of a dielectric surface and adhesion of a metal layer in a semiconductor structure 300 is depicted in FIG. 3. For the purpose of clarity, several fabrication steps leading up to the formation of the semiconductor structure are omitted. In other words, the semiconductor structure does not necessarily start out in the form illustrated in the schematic representation of FIG. 3, but may develop into the illustrated structure over one or more well-known processing steps which are not illustrated but are well-known to those of ordinary skill in the art. Note also that the semiconductor structure 300 can also be considered to be a semiconductor device and/or an integrated circuit, or some part thereof.

As shown in FIG. 3, dielectric surface 310 (e.g., corresponding to dielectric surface 106) is molecularly modified by reacting with coupling agent 320 to yield molecularly modified dielectric surface 330 (e.g., corresponding to dielectric surface 106'). In one embodiment, dielectric surface 310 is a surface of a low-k dielectric. For example, dielectric surface 310 may be an ultra-low-k (ULK) surface. As shown, dielectric surface 310 comprises surface OH (i.e., hydroxyl) groups. In one embodiment, and as shown, coupling agent 320 comprises a silane coupling agent. It is to be understood that the silane coupling agent depicted in FIG. 3 is an exemplary coupling agent, and it is to be appreciated that other coupling agents may be used to yield the molecularly modified dielectric surface 330, in accordance with the embodiments described herein.

As further shown in FIG. 3, barrier metal material 340 (e.g., corresponding to barrier metal layer 108) is formed on molecularly modified dielectric surface 330. In one embodiment, barrier 340 is comprised of Ti, Ta, or similar metal. However, barrier metal material 340 may be comprised of any material having properties suitable for functioning as a diffusion barrier material, in accordance with the embodiments described herein. The nitridizing group of the molecularly modified dielectric substrate 330 coordinates with Ta, Ti, or similar metals, in a way that promotes the adhesion of the metal with the substrate, and effectively acts as a barrier to the reaction of the Ta, Ti, or similar metals with oxygen species, including water, as well as a barrier for interconnect metal diffusion.

Note that the coupling agent 320 illustrated in FIG. 3 represents the substrate anchor group (210 in FIG. 2) and the linking group (220 in FIG. 2), while the molecular structure shown between the dielectric surface 330 and the barrier metal layer 340 represents the nitridizing reactive group (230 in FIG. 2).

Referring now to FIG. 4, a method 400 for fabricating a substrate having a nitridizing dielectric surface is shown. Again, for the purpose of clarity, several fabrication steps leading up to the fabrication of the substrate are omitted. When viewed as a whole, FIG. 4 illustrates a method wherein a set of molecules composed from a matrix of molecules illustrated in, for example, FIG. 3, reacts to a dielectric with surface hydroxyl groups, forming a self-assembling monolayer that terminates with a nitridizing functional group.

More particularly, as shown at stage 410, a substrate 102 is shown having a surface 106 comprised of a plurality of hydroxyl (OH) groups. Then, as depicted in stage 420, monolayer 106' is formed via a reaction with the OH groups of surface 106. In one embodiment, monolayer 106' is a self-assembling monolayer that terminates with a nitridizing functional group. For example, monolayer 106' may be formed from self-assembling molecules comprising a functional group that binds to the substrate (e.g., siloxane), a functional group that nitridizes a barrier metal material (e.g., an amine, a nitrile, or an azide), and a connector joining the two functional groups and that enables the formation of monolayer (e.g., methylene).

The nitridizing functional group of monolayer 106' is configured to coordinate with a barrier metal material in a way that promotes the adhesion of the barrier metal material with substrate 102. The nitridizing functional group effectively acts as a barrier to reaction of the barrier metal with oxygen species (e.g., water).

In stage 430, barrier metal material 108 is formed on monolayer 106' of substrate 102. Barrier metal material 108 may be comprised of Ta, Ti, or any suitable material in accordance with the embodiments described herein.

Advantageously, the modification of a substrate (e.g., a dielectric substrate) with surface hydroxyl groups in accordance with the embodiments described above enables the substitution of Ta for TaN, Ti for TiN, etc. as a barrier metal in applications where there is a sensitivity to an oxidizing agent, such as water. This substitution reduces the effective resistance of the resulting interconnect structures, such as vias. Furthermore, the fabrication of structures using self-assembling molecules permits the exposure of (non-metallized) interconnect structures to environments containing oxidizers, such as water or oxygen, for periods greater than about one hour without compromising electrical or barrier properties. In one embodiment, a metal oxide, such as copper oxide, may be reduced to avoid compromise of the dielectric targeted for the self-assembling treatment described herein. Copper oxide can be formed on the top surface of a copper underlayer when it is exposed to air after trench and via opening. Thus, copper oxide needs to be reduced to metal copper by either a chemical or physical pre-clean process after nitridization. The pre-clean process should not damage the nitridized dielectric surface or impact properties of the dielectric.

Figure 5:
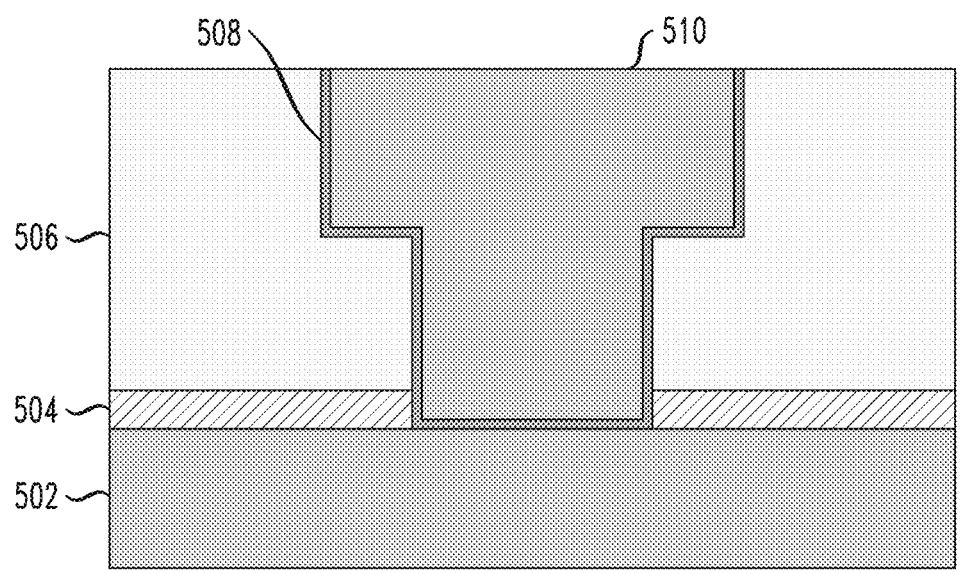
FIG. 5 illustrates a schematic cross-sectional side view of a portion of an integrated circuit with an enhanced barrier metal layer, according to an embodiment of the invention.

Lastly, FIG. 5 illustrates a schematic cross-sectional side view of a portion of an integrated circuit with an enhanced barrier metal layer, according to an embodiment of the invention. As mentioned above, the molecular modification and nitridization process described herein in accordance with one or more embodiments may be applied to the fabrication of one or more interconnect structures (e.g., vias) in an integrated circuit device. Such an interconnect structure is shown in FIG. 5 as part of integrated circuit 500. For purposes of clarity, the specific processes for forming each layer shown in FIG. 5 will not be described as they have been explained in detail above or are otherwise well known. One purpose of FIG. 5 is to illustrate where in the interconnect structure that an enhanced (nitridized) barrier metal layer, formed in accordance with embodiments described herein, is implemented within an integrated circuit.

As shown, device 500 comprises a first copper layer 502. It is to be understood that the first copper layer 502 can be part of an integrated circuit component that is fabricated as part of the FEOL stage for device 500. Formed on top of the first copper layer 502 is a capping layer 504. Capping layer 504 provides protection for the first copper layer 502, and may be comprised of dielectric material such as, but not limited to, SiN, $O_xN$, etc.

As further illustrated, dielectric substrate 506 (e.g., corresponding to dielectric substrate 102) has at least one opening having formed therein an enhanced barrier metal layer 508 and a second copper layer 510. It is to be appreciated that the enhanced barrier metal layer 508 is formed using the molecular modification and nitridization process described herein in FIGS. 1A-1D, and 2-4. The second copper layer 510 is deposited as described above following the description of FIG. 1D. In one embodiment, the second copper layer 508 is a via (interconnect) to the first copper layer 502 and is formed as part of the BEOL stage for device 500. The enhanced barrier metal layer 508 chemically isolates dielectric substrate 506 from the second copper layer 510, while maintaining an electrical connection between the second copper layer 510 and surrounding regions, i.e., the first copper layer 502. However, unlike existing barrier metal layers, enhanced barrier metal layer 508 has a reduced effective resistance due to the method of fabricating the enhanced barrier metal layer as described herein.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or another input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for fabricating a semiconductor structure, comprising:
    forming a substrate, wherein the substrate comprises a low-k dielectric material having a dielectric constant of about 2.8 or less;
    molecularly modifying at least a portion of a surface of the substrate to convert at least a portion of the surface of the substrate to a nitrogen-enriched surface, wherein the modifying step further comprises assembling a set of molecular components on at least a portion of the surface of the substrate, and wherein each molecule of the set comprises a first functional group, a second functional group, and a connector; and
    depositing a metal layer on the molecularly modified surface of the substrate, wherein the deposited metal layer interacts with the modified surface to form a nitridized metal layer.

2. The method of claim 1, wherein the first functional group is configured to bind to the surface of the substrate.

3. The method of claim 1, wherein the second functional group is configured to promote adhesion of the metal layer to the surface of the substrate.

4. The method of claim 1, wherein the connector joins the first functional group and the second functional group.

5. The method of claim 1, wherein the set of molecular components comprises a self-assembling monolayer.

6. The method of claim 1, wherein the surface of the substrate comprises one or more hydroxyl (OH) groups, and wherein the first functional group is configured to react with the one or more OH groups.

7. The method of claim 1, wherein the first functional group is a functional group selected from the group consisting of: siloxane, $(HO)_{3-x}$—$SiH_x$—, and $(HO)_{4-x}$—$CH_x$—.

8. The method of claim 1, wherein the second functional group is a functional group selected from the group consisting of: amine, nitrile, and azide.

9. The method of claim 1, wherein the connector is comprised of a functional group selected from the group consisting of: methylene, —$(SiH_2)_n$—, and —$(Si_mC_nH_p)_z$—.

10. The method of claim 1, wherein the deposited metal layer forms a barrier layer that is conductive and mitigates contamination of material into the substrate.

11. The method of claim 1, wherein the metal layer depositing step further comprises depositing a non-nitridized metal material on the modified surface of the substrate such that the non-nitridized metal material becomes nitridized upon adhesion to the substrate.

12. The method of claim 1, further comprising depositing a metal interconnect layer on the nitridized metal layer.

13. A method for fabricating a semiconductor structure, comprising:
    forming a substrate, wherein the substrate comprises a low-k dielectric material having a dielectric constant of about 2.8 or less;
    molecularly modifying at least a portion of a surface of the substrate to convert at least a portion of the surface of the substrate to a nitrogen-enriched surface, wherein the modifying step further comprises performing a silylation process on at least a portion of the surface of the substrate; and
    depositing a metal layer on the molecularly modified surface of the substrate, wherein the deposited metal layer interacts with the modified surface to form a nitridized metal layer.

14. A method for fabricating a semiconductor structure, comprising:
    forming a substrate, wherein the substrate comprises a low-k dielectric material having a dielectric constant of about 2.8 or less;
    molecularly modifying at least a portion of a surface of the substrate to convert at least a portion of the surface of the substrate to a nitrogen-enriched surface, wherein the modifying step further comprises depositing molecules on at least a portion of the surface of the substrate, and wherein the molecules are selected to react to surface hydroxyl groups of the dielectric material and form a self-assembling monolayer that terminates with a nitridizing functional group; and
    depositing a metal layer on the molecularly modified surface of the substrate, wherein the deposited metal layer interacts with the modified surface to form a nitridized metal layer.

15. The method of claim 11, wherein the non-nitridized metal material comprises tantalum (Ta).

16. The method of claim 11, wherein the non-nitridized metal material comprises titanium (Ti).

17. A semiconductor structure, comprising:
    a substrate, wherein the substrate comprises a low-k dielectric material having a dielectric constant of about 2.8 or less and a surface, wherein at least a portion of the surface of the substrate comprises a nitrogen-enriched surface, wherein the nitrogen-enriched surface comprises a set of molecular components, and wherein each molecule of the set comprises a first functional group, a second functional group, and a connector; and
    a metal layer deposited on the nitrogen-enriched surface, wherein the deposited metal layer interacts with the nitrogen-enriched surface to form a nitridized metal layer.

18. An integrated circuit, comprising:
    a substrate, wherein the substrate comprises a low-k dielectric material having a dielectric constant of about 2.8 or less and a surface, wherein at least a portion of the surface of the substrate comprises a nitrogen-enriched surface, wherein the nitrogen-enriched surface comprises a set of molecular components, and wherein each molecule of the set comprises a first functional group, a second functional group, and a connector;
    a metal layer deposited on the nitrogen-enriched surface, wherein the deposited metal layer interacts with the nitrogen-enriched surface to form a nitridized metal layer; and
    a metal interconnect layer deposited on the nitridized metal layer.

* * * * *